United States Patent [19]

Misic et al.

[11] Patent Number: 4,920,318

[45] Date of Patent: Apr. 24, 1990

[54] SURFACE COIL SYSTEM FOR MAGNETIC RESONANCE IMAGING

[75] Inventors: George J. Misic, Hiram; Gregory C. Hurst, Shaker Hts.; G. Neil Holland, Chagrin Falls; John L. Patrick, III, Solon; Paul T. Orlando, Euclid, all of Ohio

[73] Assignee: Picker International, Inc., Highland Hts., Ohio

[21] Appl. No.: 252,819

[22] Filed: Oct. 3, 1988

Related U.S. Application Data

[62] Division of Ser. No. 765,708, Aug. 14, 1985, Pat. No. 4,793,356.

[51] Int. Cl.⁵ .............................................. G01R 33/20
[52] U.S. Cl. .................................... 324/318; 324/322; 128/653 A
[58] Field of Search ............... 324/307, 309, 311, 313, 324/314, 318, 322; 128/653; 455/193; 333/17 R, 17 M

[56] References Cited

U.S. PATENT DOCUMENTS

| | | | |
|---|---|---|---|
| 2,882,904 | 4/1959 | Rasmussen | 128/418 |
| 3,340,867 | 9/1967 | Kubicek et al. | 128/205 |
| 3,515,979 | 6/1970 | Golay | 324/318 |
| 4,095,168 | 6/1978 | Hlavka | 324/318 |
| 4,129,322 | 12/1978 | Traficante | 324/318 |
| 4,398,149 | 8/1983 | Zens | 324/319 |
| 4,450,408 | 5/1984 | Tiemann | 324/318 |
| 4,545,384 | 10/1985 | Kawachi | 128/653 |
| 4,592,363 | 6/1986 | Krause | 128/653 |
| 4,602,213 | 7/1986 | Sugiura | 324/313 |
| 4,633,181 | 12/1986 | Murphy-Boesch et al. | 324/318 |
| 4,634,980 | 1/1987 | Misic et al. | 324/322 |
| 4,649,348 | 3/1987 | Flugan | 324/318 |
| 4,672,972 | 6/1987 | Berke | 128/653 |
| 4,680,549 | 7/1987 | Tanttu | 324/318 |
| 4,698,595 | 10/1987 | Röschmann | 324/313 |
| 4,763,076 | 8/1988 | Arakawa et al. | 324/322 |

FOREIGN PATENT DOCUMENTS 2151791 7/1985 United Kingdom .

Primary Examiner—Hezron E. Williams
Assistant Examiner—Kevin D. O'Shea
Attorney, Agent, or Firm—Fay, Sharpe, Beall, Fagan, Minnich & McKee

[57] ABSTRACT

A resonance exciting coil (C) excites magnetic resonance in nuclei disposed in an image region in which a main magnetic field and transverse gradients have been produced. A flexible receiving coil (D) includes a flexible plastic sheet (40) on which one or more loops (20) are adhered to receive signals from the resonating nuclei. Velcro straps (46) strap the flexible sheet and the attached coil into close conformity with the surface of the portion of the patient to be imaged. An impedance matching or coil resonant frequency adjusting network (50) is mounted on the flexible sheet for selectively adjusting at least one of an impedance match and the peak sensitivity resonant frequency of the receiving coil. A preamplifier (52) amplifies the received signals prior to transmission on a cable (24). A selectively variable voltage source (70) applies a selectively adjustable DC bias voltage to the cable for selectively adjusting at least one of the impedance match and the LC resonant frequency of the receiving coil. The received signals are amplified by an amplifier (82) and processed by an image processor (30) to form man-readable images of the examined region of the patient for display on a video display (32) or the like.

13 Claims, 6 Drawing Sheets

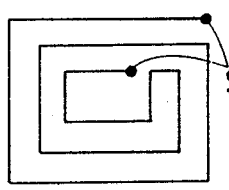 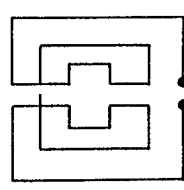 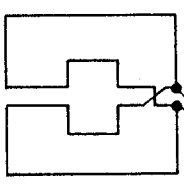
FIG.4E  FIG.5E  FIG.6E
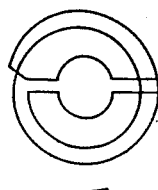 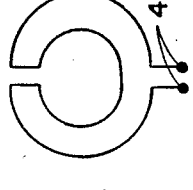 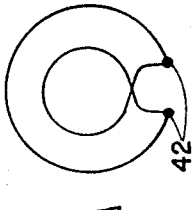
FIG.4D  FIG.5D  FIG.6D
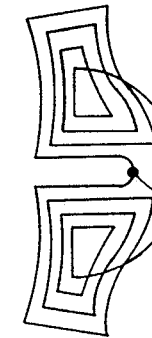 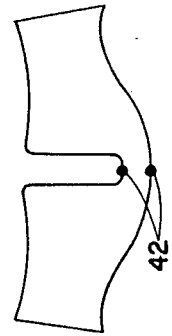 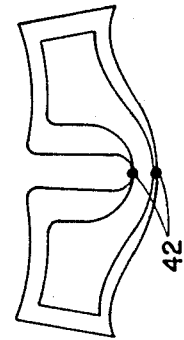
FIG.4C  FIG.5C  FIG.6C
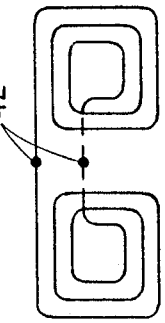 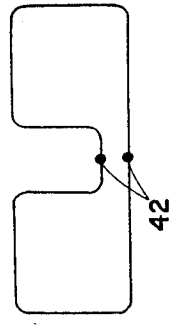 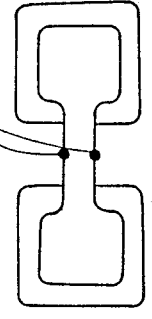
FIG.4B  FIG.5B  FIG.6B
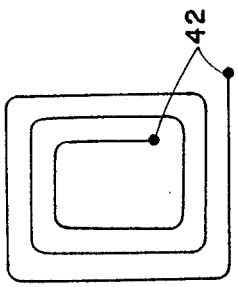 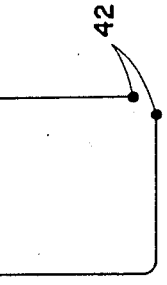 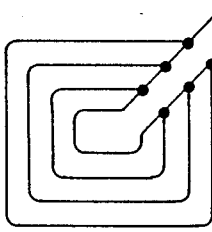
FIG.4A  FIG.5A  FIG.6A

SURFACE COIL SYSTEM FOR MAGNETIC RESONANCE IMAGING

This is a division of application Ser. No. 765,708, filed Aug. 14, 1985, now U.S. Pat. No. 4,793,356.

BACKGROUND OF THE INVENTION

The present invention relates to the art of magnetic resonance spectroscopy. More particularly, the present invention relates to coils for receiving electromagnetic signals from resonating nuclei. Although the present invention finds application in the field of medical imaging, it is to be appreciated that the invention also finds utility in other magnetic resonance applications, such as well logging, chemical analysis, and the like.

Heretofore, there have been two primary categories of receiving coils for magnetic resonance imaging and spectroscopy of selected body areas of the patient. First, a standard sized whole body coil or body portion receiving coil was dimensioned to be disposed around the portion of the patient to be imaged. Due to the standard sizing, a significant void or empty region was defined between the coil and the portion of the patient to be imaged. As the imaged portion of the patient became a smaller fraction of the coil volume, the signal-to-noise ratio was decreased, degrading the image quality. Further, the standard sized coils included no means to eliminate or reduce aliasing in two or three dimensional Fourier transform sequences. The other type of receiving coil was formed by wrapping wire or other conductors on flat, rigid sheets of plastic or nylon. The flat coils were constructed in a variety of sizes to facilitate being positioned adjacent an area of the patient to be imaged. However, their planar nature permitted only limited, partial contact with the patient.

The rigid, standard sized body and body portion coils and the rigid, planar coils did not permit optimization of image quality. Rather, the lack of conformity with the patient failed to optimize the filling factor decreasing the signal-to-noise ratio. These rigid coils received resonance signals from over a significantly larger area than the region of interest. This sensitivity to extraneous information degraded spatial resolution and increased aliasing in two and three dimensional Fourier transform methodology. Improvement in the homogeneity of receiver sensitivity across the imaged space sacrificed the quality or Q factor of the coil, particularly in coils having resonance frequencies above 20 MHz. Moreover, the rigid coils were difficult to apply to the patient, uncomfortable, and created a need for a large range inventory of coil sizes.

Other problems have been encountered in transferring the signal received by the high impedance coil over low impedance transmission lines to a remote, out of the image region preamplifier. To minimize signal loss and noise, the length of the low impedance transmission line was minimized. Although short unmatched transmission lines functioned acceptably at low frequencies, the Q factor of the coil degraded rapidly with increasing frequency and cable length.

Matching the transmission line length to the wave length at the operating frequency resulted in excessive length at low and mid-field strengths and lines that were too short at high fields. Because the coil impedance greatly exceeded the transmission line impedance, high cable losses attributable to standing waves on the cable were experienced. Moreover, non-zero cable dielectric and conductor losses damped the surface coil.

Attempting to match the impedance of the transmission line, whether balanced or unbalanced, has been unsuccessful. The normal variations in patient loading caused a corresponding impedance mismatch and resultant power transfer loss. At mid and high magnetic field strengths the patient loading mismatch and transmission loss were magnified.

The present invention provides a new and improved coil and coil signal transmission system which overcomes the above referenced problems and others.

SUMMARY OF THE INVENTION

In accordance with one aspect of the present invention, a flexible receiving coil is provided for magnetic resonance imaging. A sheet of flexible material is configured to conform to a selected surface portion of an examined patient. A retaining means, such as velcro or tie straps, selectively retains the flexible sheet in conformity with the selected patient surface portion. An electrically conductive foil is adhered to the flexible sheet in a selected coil pattern. At least one electrical component is mounted on the flexible plastic sheet in an electrically conductive relationship with the conductive foil to enhance the receipt of radio frequency signals thereby.

In accordance with another aspect of the present invention, a receiving coil is provided for receiving radio frequency signals from resonating nuclei. The coil includes first and second electrically conductive loops. The loops are connected electrically in parallel such that the inductance of the parallel connected loops is less than the inductance of either of the first or second loops alone. The loops are configured to be disposed adjacent the resonating nuclei to receive the radio frequency signals therefrom.

In accordance with another aspect of the present invention, an apparatus for receiving radio frequency signals from resonating nuclei is provided. An electrically conductive coil is configured to be disposed adjacent the resonating nuclei. A resonant frequency adjusting means selectively adjusts the resonant frequency of the coil. The resonant frequency adjusting means is mounted to the coil to be disposed adjacent the resonating nuclei therewith. A conductive lead extends from the loop coil and the frequency adjusting means to a remotely located signal processing circuit. A resonant frequency control means selectively controls the resonant frequency adjusting means for selectively controlling adjustment of the coil resonant frequency. The resonant frequency control means is operatively connected with the conductive lead adjacent the remotely located processing circuit.

In accordance with another aspect of the present invention, a impedance coil is configured to be disposed adjacent resonating nuclei. A non-ferrous, high impedance preamplifier is mounted closely adjacent the coil within a magnetic field for resonating the nuclei.

In accordance with a more limited aspect of the embodiment, remotely located control means are provided for selectively adjusting at least one of the impedance and the resonant frequency of the coil.

In accordance with yet another aspect of the present invention, a magnetic resonance imaging apparatus is provided. The apparatus includes a main magnetic field generating means for generating a main magnetic field longitudinally along an imaging region. A gradient field means selectively produces magnetic field gradients across the main magnetic field in the imaging region. A magnetic resonance means excites magnetic resonance in nuclei of a patient disposed in the imaging region. A flexible coil is disposed in conformity with a surface portion of the patient to receive radio frequency signals from the resonating nuclei thereadjacent. An image reconstruction means for reconstructing an image representative of resonating nuclei position and density is operatively connected with the flexible coil.

A primary advantage of the present invention is that it provides an improved filling factor and a higher signal-to-noise ratio.

Another advantage of the present invention is that it reduces and controls the regions of sensitivity.

Yet another advantage of the present invention resides in the reduction or elimination aliasing, particularly in localized imaging with an expanded field of view during two and three dimensional Fourier transform processing of the receiving signals.

Still further advantages of the present invention will become apparent to those of ordinary skill in the art upon reading and understanding the following detailed description of the preferred embodiments.

A BRIEF DESCRIPTION OF THE DRAWINGS

The invention may take form in various parts and arrangements of parts. The drawings are only for purposes of illustrating preferred embodiments of the invention and are not to be construed as limiting it.

Figure 9:
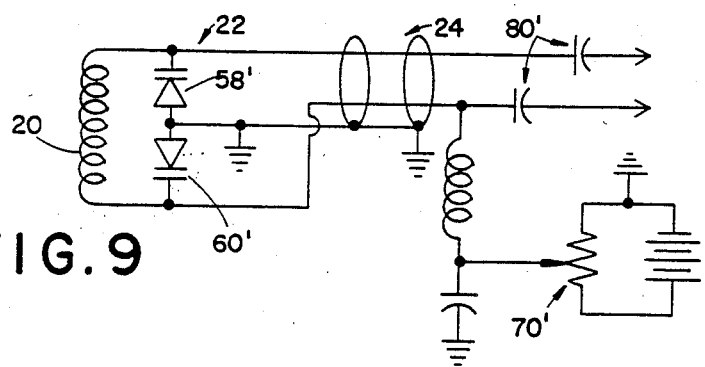
Figure 10A:
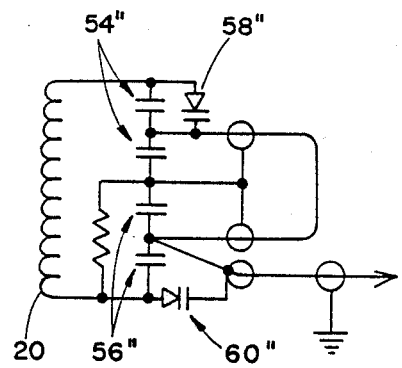
Figure 10B:
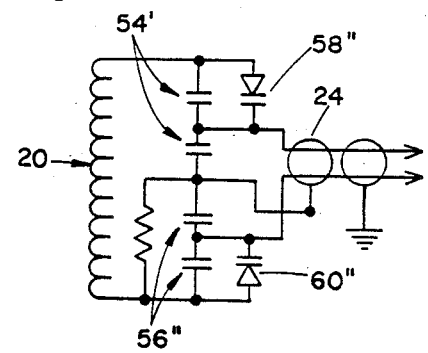
Figure 10C:
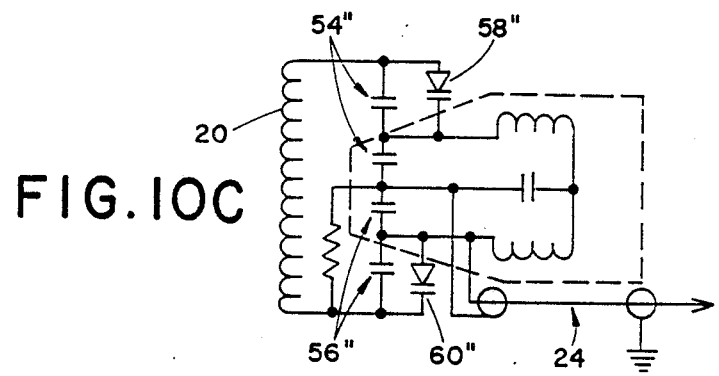
Figure 7:
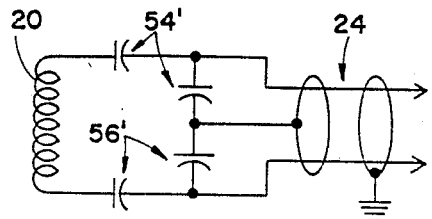
Figure 8:
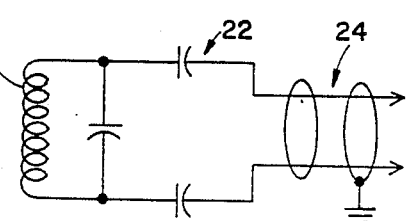
Figure 11:
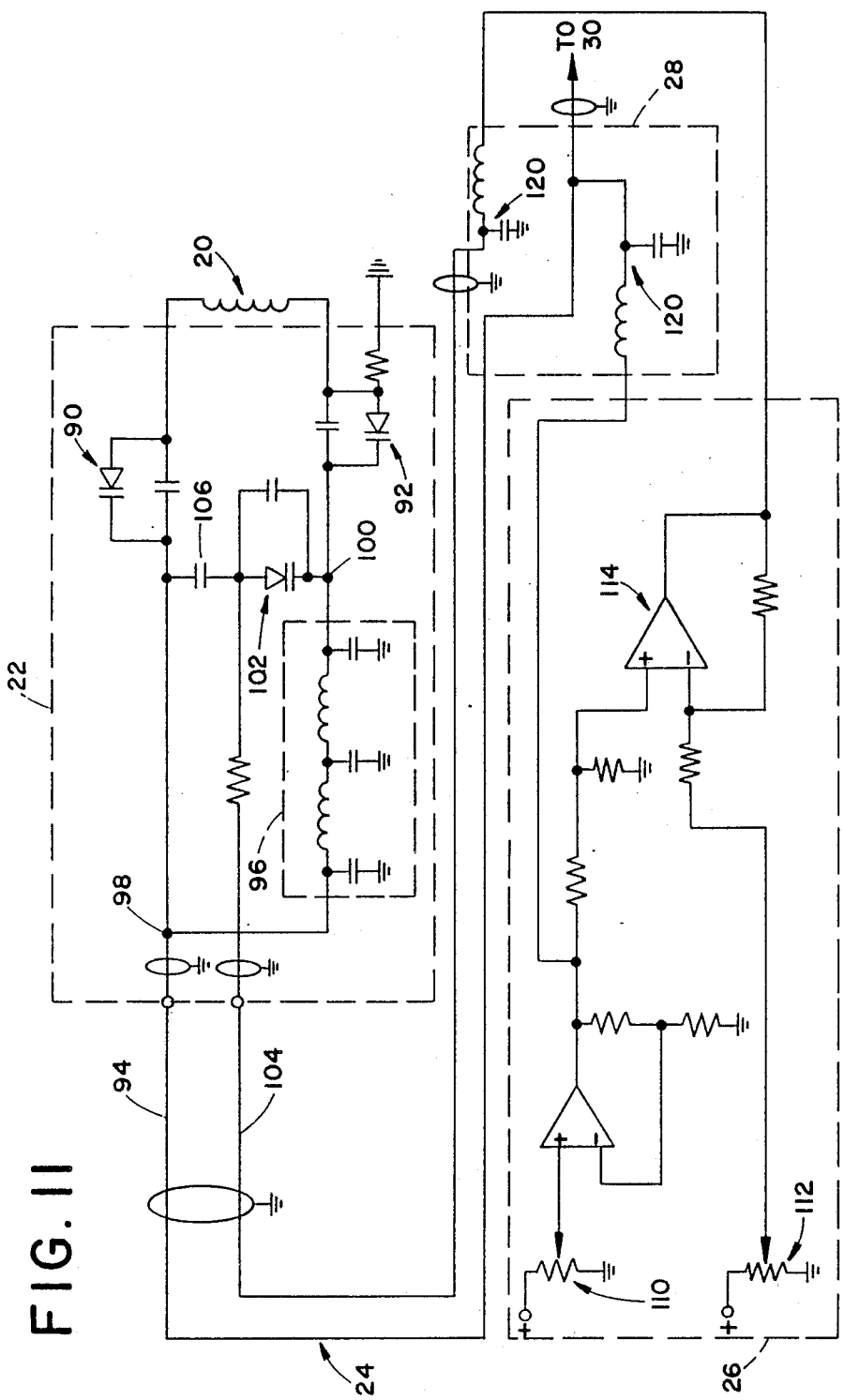

FIGS. 4A through E illustrate alternate embodiments of receiving coil patterns which are particularly adapted to receiving frequencies below 15 MHz;

FIGS. 5A through E illustrate alternate coil patterns which are particularly adapted to receiving signals in the 10 to 50 MHz range;

FIGS. 6A through E illustrate alternate coil patterns which are particularly adapted to receiving signals in the 25 to 200 MHz range;

FIG. 7 is another alternate embodiment of coil mounted signal enhancement circuitry;

FIG. 8 is another alternate embodiment of coil mounted signal enhancement circuitry;

FIG. 9 is an alternate embodiment of a remotely controlled coil mounted resonant frequency adjusting circuit;

FIGS. 10A, B and C are other alternate embodiments of coil mounted remotely controlled signal enhancement circuitry; and, FIG. 11 is yet another alternate embodiment in which both the frequency and the impedance match are each separately and remotely adjustable.

DETAILED DESCRIPTION OF THE PREFERRED EMBODIMENTS

Figure 1:
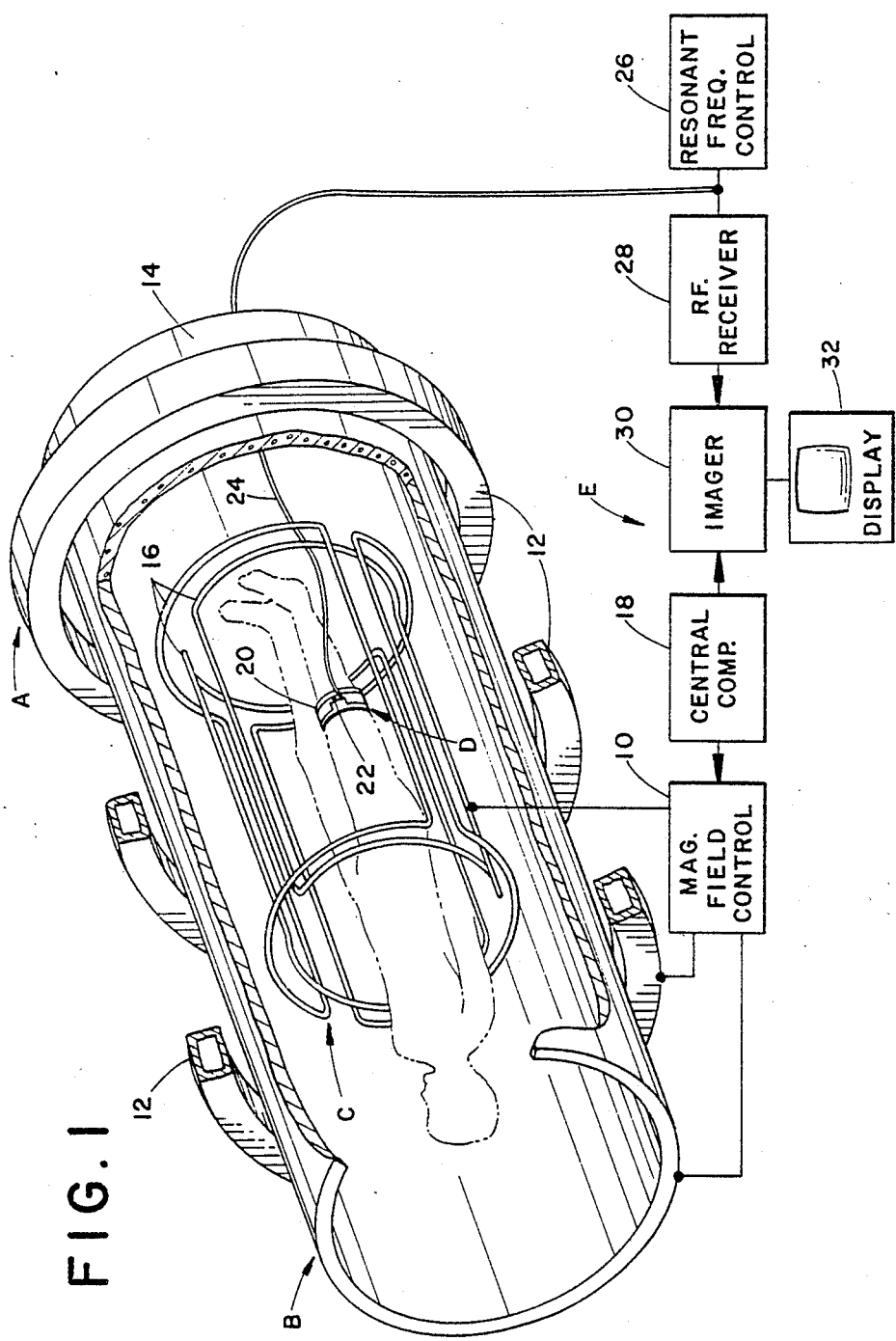
FIG. 1 is a diagramatic illustration of a magnetic resonance imaging apparatus incorporating the present invention.

With reference to FIG. 1, a magnetic resonance imaging apparatus includes a main magnetic field means A for establishing a generally uniform, main magnetic field extending longitudinally through an imaging region. A gradient field means B selectively produces magnetic field gradients transversely across the main magnetic field in the image region. A magnetic resonance excitation means C selectively excites magnetic resonance in nuclei of a patient disposed in the image region. The resonating nuclei generate radio frequency signals of a frequency which is determined by the strength of the magnetic field thereadjacent and various system constants such as the gyromagnetic ratio of the nuclei. A flexible receiving coil D is disposed in conformity with a selected portion of the patient within the image region to receive radio frequency resonance signals from the resonating nuclei. Processing circuitry E converts the received radio frequency signals into a man-readable display representative of nuclei density, position, and the like.

More particularly, the main magnetic field means A includes a magnetic field control circuit 10 and a plurality of large, superconducting or other high power magnets 12. The magnetic field control circuit 10 also functions as a portion of the gradient field means B to control the angular orientation of the transverse gradient fields generated by a gradient field coil 14. The magnetic field control circuit 10 also causes transmission coils 16 of the resonance excitation means C to exite magnetic resonance with a controlled periodicity. A central computer 18 coordinates the generation of the main, gradient, and resonance exciting magnetic fields.

The flexible receiving coil D includes one or more coils of electrically conductive materials 20 and at least one electrical componet 22 mounted therewith for enhancing receipt of resonance signals. In the preferred embodiment, the electrical component includes circuitry for adjusting the resonant frequency of the receiving coil 20 so as to match the frequency of the resonant signals and a pre-amplifier for boosting the magnitude of the received signals. A cable 24 connects the receiving coil 20 and the electrical components 22 with the remotely located processing circuitry E.

A resonant frequency control means 26 is connected with the cable 24 for selectively causing the electrical component 22 to adjust the resonant frequency of the receiving coil. A radio frequency receiver 28 receives the resonance signals from the receiving coil. An imager 30 receives the resonance signals from the radio receiver 28 and magnetic field information and other control instructions from the central computer 18. The imager reconstructs a man-readable representation or image indicative of the position, density, resonant frequency, or other characteristics of the resonating nuclei for display on a video monitor or other man-readable display 32.

Figure 2:
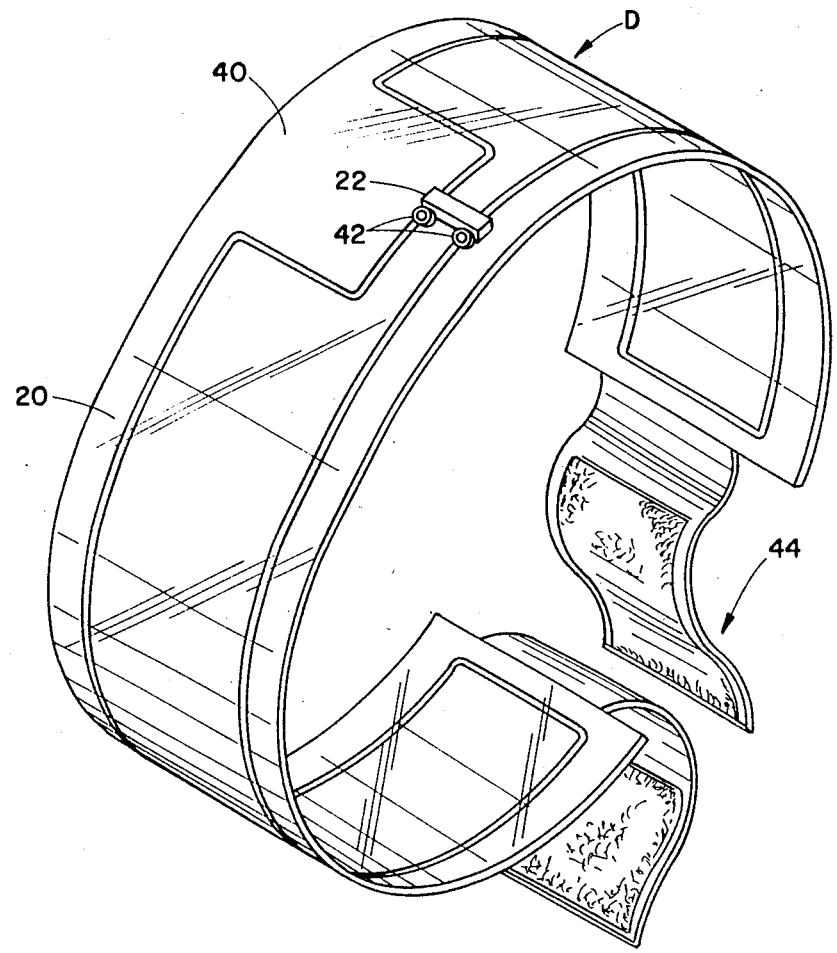
FIG. 2 is a coil construction in accordance with the present invention which is particularly adapted for conformity with a patient's knee.

With particular reference to FIG. 2, a preferred embodiment of the flexible coil D includes a sheet 40 of a flexible, non-paramagnetic material which is readily conformed to a patient's knee or other surface area of the patient adjacent an internal region to be imaged. The electrical loop coil 20 is formed of a copper foil which is attached or plated to a thin film of MYLAR, KAPTON, or like plastic films. The thin film is adhesively backed with a peel-off protective layer to facilitate cutting to the selected shape and adhering to the plastic sheet. A pair of sockets 42 connected with the coil 20 on the electrical components 22 facilitates interconnecting and removing the cable 24. The electrical components 22 are incorporated in a small assembly which is connected across the coil loops. A retaining means 44, such as a pair of VELCRO or other hook and loop connection fabric straps, are connected with the flexible plastic sheet for selectively retaining the flexible plastic sheet in conformity with the selected patient surface portion.

Figure 3:
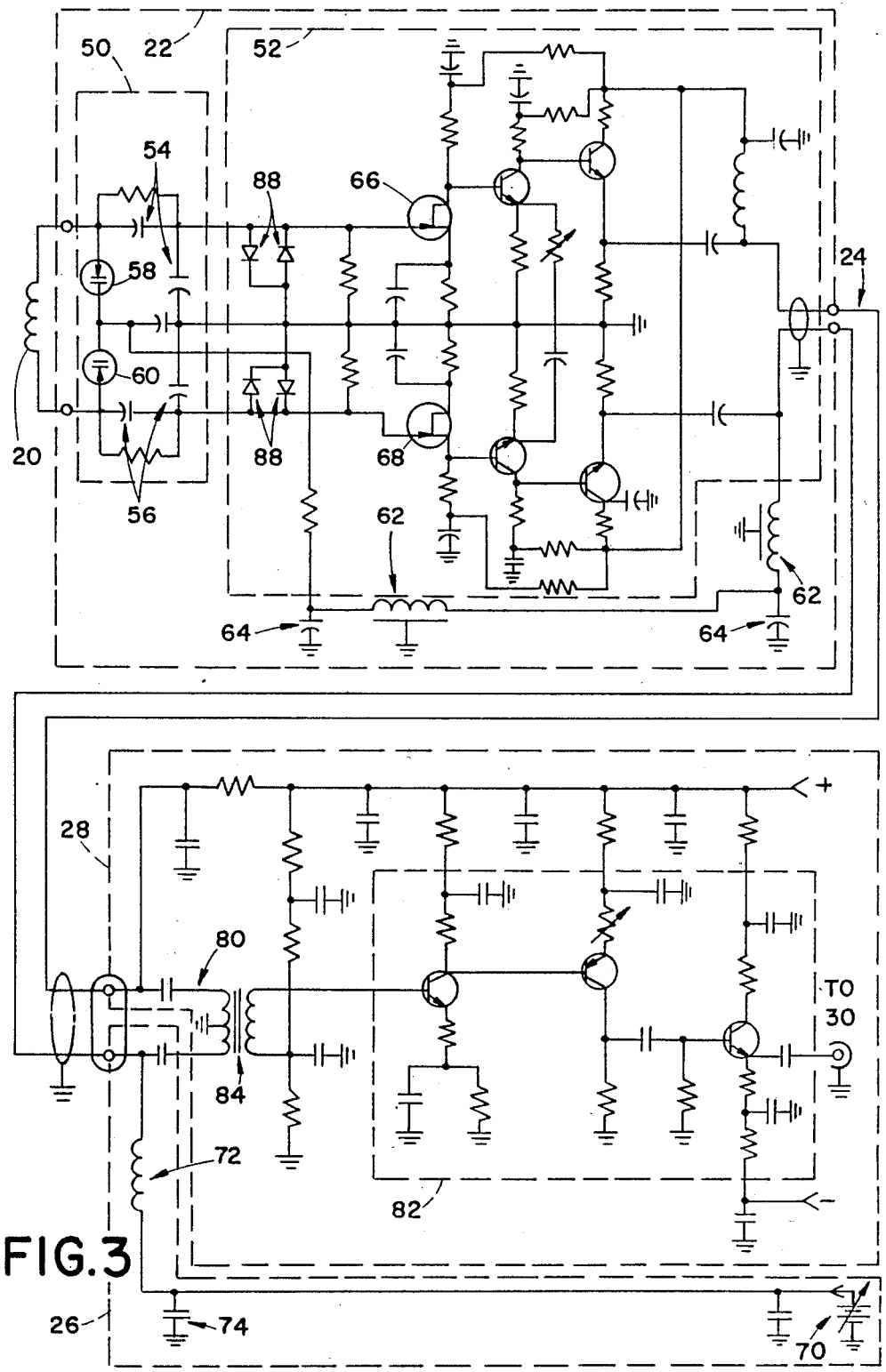
FIG. 3 is a diagramatic illustration of electrical circuitry which is mounted in part on the coil construction of FIG. 2 for matching or adjusting the resonant frequency of the coil and is in part remotely located for selectively causing the resonant frequency adjustment.

With reference to FIG. 3, the electrical component 22 includes an impedance matching or resonant frequency adjusting means or network 50 for selectively adjusting a resonant frequency of the receiving coil D. A preamplifier 52 boosts the amplitude of received resonance signals. The impedance adjusting network includes a pair of adjustable capacitor divider networks 54 and 56 each connected between one end of the receiver coil 20 and ground. The capacitor networks include variable capacitance means, such as varicap diodes or varactors 58, 60, for varying the capacitance of the network in response to an applied bias or control signal. A radio frequency choke 62 and a capacitive filter 64 remove non-DC signal components from a received capacitance control signal or bias voltage for varying the resonant frequency. The choke has a non-ferrous core to avoid saturation from the magnetic fields. Optionally, a parallel capacitor may be provided for resonating the choke at low frequencies without excessive DC resistance. The varicap diodes 58, 60 are connected between the respective ends of the receiving coil 20 and a signal ground. This change in potential varies the capacitance of an LC network formed by the coil 20 and the capacitive networks 54 and 56, particularly the varicap diodes 58, 60. Varying the capacitance varies the LC tuning of the capacitance networks and the receiver coil adjusting the resonant frequency thereof accordingly.

The preamplifier 52 has an input impedance which matches the high impedance of the receiving coil 20, typically about 20,000 ohms. The preamplifier is configured to provide an output which is capable of driving the cable 24, typically 100 ohm balanced twinaxial transmission line. A gain on the order of 15 dB is preferred. However, it is to be appreciated that the preamplifier characteristics are adjusted and selected for compatability with the attached receiving coil 20.

In the preferred embodiment, the preamplifier 52 includes a pair of high input impedance amplifiers 66, 68 in a push-pull configuration for boosting the resonance signal to drive it along the cable 24. In the preferred embodiment, the preamplifier has three direct coupled stages which minimizes size, component count, and complexity. The high input impedance first stage amplifiers 66, 68 are J-FET devices. Gain is controlled by adjusting the level of emitter bypassing available on the second amplifier stage. The third or output stage includes a push-pull emitter follower to provide low impedance to drive the low impedance cable 24. This impedance matching enables the cable 24 to extend substantial distances, such as the distance commonly encountered in well logging. Preferably, the cable 24 is an integer multiple of a half wave length cable such that the impedance adjacent the preamplifier and frequency adjusting circuit matches the impedance at the resonant frequency control circuit 26 and the radio frequency receiver 28.

The coil mounted electrical assembly 22 preferrably incorporates surface mounted components, although in the preferred embodiment the varicap diodes 58, 60 and the radio frequency chokes 62 are not. A high quality dielectric material is used as a substrate for printed circuitry in the assembly. Plated through holes are used to reach a primary ground plane of the assembly, opposite to the component side of printed circuit board. All components and materials have an extremely low ferrous content to avoid interference with and distortion of the magnetic fields. Preferably, all components and materials are non-ferrous. In the preferred embodiment, the assembly 22 is about 2 cm. by 3 cm. and 0.85 cm. thick.

The resonant frequency control means or circuit 26 includes an adjustable voltage source 70 which provides a selectively adjustable biasing voltage. A radio frequency choke 72 and a filter capacitor 74 separate the bias voltage from the resonance signals such that both can be conveyed superimposed on the cable 24.

The receiving circuit 28 includes a filter 80 for separating the radio frequency resonance signals from the DC resonant frequency adjusting bias. An amplification stage 82 and an isolation transformer 84 boost and convey the resonant frequency signals to the spectrometer. In the preferred embodiment, the signals are conveyed to the imager 30. However, it is to be appreciated that the spectrometer may process the spectrographic data to obtain other information, such as chemical composition.

When using linear polarization with separate transmit and receive coils, the transmit coil is commonly disposed orthogonally from the receive coil. With surface coil, this orthogonality is not always practical. The nature of conformal surface coils commonly prevents placement with the accuracy which is required to achieve transmit/receive isolation by orthogonality alone. To achieve decoupling of transmit and receive coils that are at least partially polarized in the same direction, the preferred embodiment uses passive diode switching. More specifically, passive crossed diodes are placed in series with each of the coil feed points to effectively open circuit the transmit coil during receive. Alternately, the diodes may be connected such that the resonant frequency of coil is altered sufficiently to reduce coupling substantially during receive, e.g. switching a capacitor out of the coil circuit to raise the resonant frequency. Preferably, PIN diodes are used such that no portion of the radio frequency waveform is lost in biasing the diodes into a conductive state.

The receiving coil 20 is decoupled with crossed diode pairs 88 which are connected between the gates of the high input impedance amplifiers 66, 68 and ground. During transmit, a negative bias is applied to the tuning line which feeds the varactor diodes 58, 60. This biases the crossed diodes 88 into forward conduction reducing the available Q of the surface coil 20 and detuning the resonant point downward.

FIG. 4A illustrates a receiver coil pattern for coils in which a length of conductor extends between the electrical connection sockets 42 or the circuit chip 22 in a generally spiral pattern. This single spiral loop pattern is particularly adapted to resonant frequencies below 10 MHz, particularly 5.6 MHz and 6.4 MHz signals.

FIG. 4B illustrates a coil which is particularly adapted to be placed on extremities such as the patient's knee or neck. It includes a pair of spiral coil loops connected in parallel with each other to the sockets 42.

FIG. 4C illustrates a coil that is particularly adapted to receive 5.6 MHz and 6.4 MHz signals adjacent to the patient's neck. The neck coil includes two spiral pattern coils each shaped to conform to one side of the patient's neck passing around and over the patient's shoulders.

Each spiral coil portion is generally a skewed trapezoid with parallel base and top edges that extend longitudinally along the front and back of the patient's neck and slightly curved sides which pass over the patient's shoulder and around the patient's jaw and ear.

FIG. 4D illustrates a coil pattern that is particularly adapted to focus signals adjacent a patient's inner ear. An inner most winding effectively circles in one direction while the two outer windings circle in the opposite direction to limit the area of sensitivity. This enables a received signal to be dominated by inner ear originating components rather than surrounding tissue. Analogously, transmitted signals are centrally focused.

FIG. 4E illustrates a winding pattern for examinations of the lumbar and thoracic spine regions. The inner most rectangular loop is surrounded by two outer loops which are wound in the opposite direction. This increases sensitivity to signal components originating in the spine and reduces components from surrounding tissue. Transmitted signals are similarly directed centrally.

FIGS. 5A through 5E illustrate winding patterns for coils which are adapted to be tuned to the 10-50 MHz range, particularly the 17 and 21 MHz frequencies. FIG. 5A illustrates a coil which is essentially a single loop. FIG. 5B illustrates bow-tie shaped coils which are particularly adapted for imaging extremities such as the patient's knee or elbow. A pair of single loop coils are connected with the sockets 42, i.e. in parallel with each other.

FIG. 5C illustrates a coil arrangement in which a pair of single loop generally skewed trapezoidal coils are connected in parallel with the sockets 42. Each skewed trapezoidal portion is configured essentially as in the outer ring of FIG. 4C such that the ends of each coil loop extend longitudinally along the front and back of the patient's neck and the side portions extend around and over the patient's shoulder and under and along the patient's jaw.

FIG. 5D is effectively two loops in series, each extending in opposite directions to focus received and transmitted signals centrally. FIG. 5E, like FIG. 4E, is effectively three concentric rectangular loops connected in series with the central loop extending opposite to the outer loops.

FIGS. 6A through 6E illustrate coils which are particularly adapted to operate above 50 MHz, particularly at 64 or 85 MHz. FIG. 6A illustrates a square coil which includes four concentric coil loops connected in parallel. FIG. 6B illustrates a coil arrangement which is particularly adapted for imaging extremities such as knees or elbows. A pair of concentric, parallel connected loops are connected in parallel with each other across the socket 42. In FIG. 6C, a first pair of generally skewed trapezoidal coils are configured to fit around one side of a patient's neck. A second, mirror image pair of skewed trapezoidal coils are connected in parallel with the first pair across the sockets 42 to fit around the other side of the patient's neck. In FIG. 6D, a pair of concentric loops are connected electrically in parallel with each other and arranged such that the current flows through each loop in the opposite direction. FIG. 6E illustrates a coil in which two loops are connected in parallel. The two loops are arranged to define two effective loops with the inner loop extending in an opposite direction to the outer loop.

It is to be appreciated that the illustrated coil constructions have application beyond flexible receiving coils. The patterns find application in fixed and rigid coil systems, such as head or body systems. Further, the illustrated coils may also be used for transmission. The coil patterns with oppositely extending windings to control the region of sensitivity are particularly advantageous in transmission systems.

FIG. 7 illustrates an alternate frequency selection circuit. Capacitive networks 54' and 56' are sized to select the resonant frequency and impedance of the receiving coil 20.

FIG. 8 illustrates another resonant frequency selection circuit. A network of capacitors are sized to match the LC resonant frequency of the receiving coil 20 to a selected resonant frequency and impedance.

FIG. 9 illustrates an alternate embodiment to the remote frequency adjusting system of FIG. 3 which is particulary adapted for resonant frequencies in the 10-50 MHz range. A variable voltage source 70' applies a variable voltage to the connecting cable 24. The receiving coil 20 is connected with a pair of varicap diodes 64', 66' which are grounded at a common interconnection. The variable voltage is applied unevenly across the varicap diodes to alter the impedance, particularly the capacitance, hence the resonant frequency characteristics of the coil 20. A DC filter means 80' separates received radio frequency signals from the DC bias signal for further processing.

FIGS. 10A, B and C illustrate yet another alternate embodiment of the electrical component assembly 22 which is particularly adapted to operation with resonant frequencies of 25-200 MHz. Each is selected to enhance one or more performance characteristics. Each assembly includes a pair of varicap diode 58", 60" or other variable capacitance means which are connected with the receiving coil 20 to adjust the impedance, hence the resonant frequency thereof. A DC potential is selectively applied to the center conductor(s) of the cable 24 to adjust the capacitance and the resonant frequency.

In the embodiment of FIG. 11, the resonant frequency and the impedance match are independently and remotely adjustable. The on coil assembly 22 includes a pair of variable capacitance networks 90 and 92 interconnected with the receiving coil 20. One of the variable capacitance networks is connected directly with a tuning bias line 94 of the lead 24 and the other is connected with the tuning bias line through a balun assembly 96. Feed points 98, 100 are defined at opposite ends of the balun assembly.

A third variable capacitance network 102 is connected between an impedance matching bias line 104 of the lead 24 and one of the feed points 100. A fixed capacitance 106 is connected between the matching bias line and the other feed point 98.

The control circuit 22 includes a resonant frequency adjusting means 110 which applies a selectively adjustable DC bias to the tuning bias line 94. An impedance match adjusting means 112 applies a selectively adjustable DC bias to the impedance matching bias line 104. A subtraction means 114 subtractively combines the tuning and impedance matching DC biases to minimize the effect of one of the bias adjustments on the other.

In this manner, the DC bias applied to the tuning bias line 94 selectively adjusts the total capacitance applied across the receiving coil, hence the resonant frequency thereof. The DC bias on the impedance matching bias line 104 adjusts the capacitance of the third variable capacitance network 102, hence the ratio of the capacitances across the feed points 98, 100, i.e. the impedance match.

The receiving circuit 28 includes a DC filter 120 for separating the DC bias signal from the radio frequency resonance signals transmitted over the lead 24.

The invention has been described with reference to the preferred embodiments. Obviously, modifications and alterations will occur to others upon reading and understanding the preceding detailed description. It is intended that the invention be construed as including all such alterations and modifications in so far as they come within the scope of the appended claims or the equivalents thereof.

Having thus described the preferred embodiments, the invention is now claimed to be:

1. A magnetic resonance apparatus for receiving radio frequency resonance signals generated by resonating nuclei, the apparatus comprising:
   an electrically conductive coil which is positionable to receive the radio frequency resonance signals from resonating nuclei;
   a preamplifier mounted to the coil for amplifying the received resonance signals;
   a conductive lead means extending from the preamplifier to a remotely located radio frequency signal processing circuit for conveying the received radio frequency resonance signals to the processing circuit and for conveying electrical power to the preamplifier from the processing circuit;
   an impedance adjusting means mounted to the coil for selectively adjusting an impedance match between the preamplifier and at least one of the coil and conductive lead;
   a resonant frequency adjusting means mounted to the coil for selectively adjusting a resonant frequency of the coil; and,
   a control means for selectively controlling the impedance adjusting means and the resonant frequency adjusting means to adjust the impedance match and the coil resonant frequency, the control means being remotely located from the coil.

2. The apparatus as set forth in claim 1 wherein the impedance adjusting means and the resonance frequency adjusting means both include variable capacitance means whose effective capacitance is adjusted by at least one bias signal applied to the conductive lead by the control means.

3. The apparatus as set forth in claim 2 wherein the remotely located radio frequency processing circuit includes an image reconstruction means for reconstructing an image representation from the received radio frequency resonance signals.

4. A flexible receiving coil assembly for magnetic resonance imaging, the coil assembly comprising:
   a sheet of flexible dielectric material;
   a preamplifier mounted on the flexible sheet, which preamplifier amplifies radio frequency signals;
   an electrically continuous foil strip mounted to and extending along a face of the flexible sheet to receive radio frequency magnetic resonance signals, the foil strip being connected with the preamplifier such that the received radio frequency magnetic resonance signals are amplified by the preamplifier; and,
   a cable extending from the preamplifier to a remote location for conveying electrical power from the remote location to the preamplifier to provide operating power thereto and for conveying the amplified radio frequency magnetic resonance signals to the remote location, whereby amplification of the magnetic resonance signals before transmission on the cable reduces interference and losses during transmission along the cable.

5. A flexible receiving coil assembly for magnetic resonance imaging, the coil assembly comprising:
   a sheet of flexible dielectric material;
   a preamplifier mounted on the flexible sheet;
   an electrically continous foil strip mounted to and extending along a face of the flexible sheet to receive radio frequency magnetic resonance signals, the foil strip being connected with the preamplifier such that the received radio frequency magnetic resonance signals are amplified by the preamplifier;
   a retaining means for selectively retaining the flexible sheet in conformity with a selected surface portion and releasing the flexible sheet to facilitate removal; and,
   a cable extending from the preamplifier to a remote location for conveying electrical power from the remote location to the preamplifier to provide operating power thereto and for conveying the amplified radio frequency magnetic resonance signals to the remote location, whereby amplification of the magnetic resonance signals before transmission on the cable reduces interference and losses during transmission along the cable.

6. The receiving coil assembly as set forth in claim 5 further including a pair of electrical connection sockets for receiving the cable, the sockets being mounted to the flexible sheet adjacent and electrically connected with the preamplifier, the electrically conductive foil strip being disposed in at least a first foil loop extending along the flexible material to one side of the sockets and a second loop extending symmetrically to an opposite side of the sockets.

7. The receiving coil assembly as set forth in claim 6 wherein the first foil loop is disposed in a generally skewed first trapezoid such that first and second sides of the first loop are configured to extend longitudinally along the front and back of a patient's neck, a third side of the first loop is configured to extend along the patient's neck around one of the patient's shoulders, and a fourth side is configured to extend along the patient's neck along one side of the patient's jaw; and,
   the second foil loop is disposed in a generally skewed second trapezoid such that first and second sides of the second loop extend longitudinally along the front and back of a patient's neck, a third side of the second loop is configured to extend along the patient's neck around another of the patient's shoulders and a fourth side is configured to extend along the patient's neck along the patient's jaw.

8. A flexible receiving coil assembly for magnetic resonance imaging, the coil assembly comprising:
   a sheet of flexible dielectric material;
   a preamplifier mounted on the flexible sheet;
   an electrically continous foil strip mounted to and extending along a face of the flexible sheet to receive radio frequency magnetic resonance signals, the foil strip being connected with the preamplifier such that the received radio frequency magnetic resonance signals are amplified by the preamplifier;
   a frequency adjusting means for selectively adjusting a resonant frequency of the receiving coil; and,
   a cable extending from the preamplifier to a remote location for conveying electrical power from the remote location to the preamplifier to provide operating power thereto and for conveying the amplified radio frequency magnetic resonance signals to the remote location, whereby amplification of the magnetic resonance signals before transmission on the cable reduces interference and losses during transmission along the cable.

9. A magnetic resonance apparatus comprising:

means for supporting a neck of a patient within an image region;

means for exciting dipoles in the patient's neck such that resonance signals are generated by the dipoles;

a neck coil selectively positioned in contact with an outer surface of the patient's neck to receive the resonance signals, the neck coil including:
- a flexible sheet which is configured to be selectively wrapped around and secured in contact with the patient's neck by a securing means, such that the securing means enables the flexible sheet to be wrapped around the patient's neck in contact therewith and removed from the patient's neck;
- a pair of electrical contacts disposed generally centrally on the flexible sheet for interconnection with an electrical cable;
- a first electrically conductive loop extending from one of the electrical contacts along one side of the flexible sheet and to the other contact and a second electrically conductive loop extending between the pair of contacts and along another side of the flexible sheet from the first loop, the second loop being a mirror image of a first loop such that the flexible sheet is positionable with the first and second loops symmetrically disposed about the patient's neck to receive the resonance signals;

a signal processing circuit connected with the electric cable for processing the resonance signals received from the neck coil.

10. The magnetic resonance apparatus as set forth in claim 9 further including a preamplifier mounted on the flexible sheet for amplifying the resonance signals prior to transmission along the cable.

11. The magnetic resonance apparatus as set forth in claim 9 further including:
- an adjusting means electrically connected with the electrical contacts for adjusting at least one of the resonance frequency of the neck coil and an impedance match; and,
- a control means connected with the electric cable for controlling the adjusting means with control signals conveyed along the electric cable.

12. A magnetic resonance imaging apparatus comprising:
- a main magnetic field generating means for generating a main magnetic field longitudinally along an image region;
- a gradient field means for producing magnetic field gradients across the main magnetic field in the image region;
- a magnetic resonance excitation means for exciting magnetic resonance in nuclei in the image region such that the nuclei generate resonance signals;
- a patient positioning means for supporting a patient such that a neck of the patient is disposed in the image region;
- a flexible neck coil disposed in conformity with a surface of the patient's neck for at least receiving the resonance signals generated by the resonating nuclei in the patient's neck, the neck coil including:
  - a first conductive loop disposed in a generally skewed first trapezoid such that first and second sides of the first trapezoid loop extend longitudinally along the front and back of the patient's neck, a third side of the first loop extends along the patient's neck around one of the patient's shoulders, and a fourth side extends along the patient's neck along one side of the patient's jaw,
  - a second conductive loop disposed in a generally skewed second trapezoid such that first and second sides of the second trapezoidal loop extend longitudinally along the front and back of the patient's neck, a third side of the second trapezoidal loop extends along the patient's neck around another of the patient's shoulders, and a fourth side extends along the patient's neck along the patient's jaw;
- an image reconstruction means for reconstructing a representation of an image of resonating nuclei position and density, the image reconstruction means being operatively connected with the first and second conductive segments.

13. A magnetic resonance imaging apparatus comprising:
- means for exciting dipoles in an image region to generate magnetic resonance signals;
- a detection coil for detecting the magnetic resonance signals emanating from the imaging region;
- a processing means for processing the detected magnetic resonance signals into an image representation;
- a control line for conveying the magnetic resonance signals from the detection coil to the processing means;
- an adjusting means connected with the detection coil for adjusting at least one of a resonance frequency of the detection coil and an impedance match; and,
- a control means connected with the control line for controlling the adjusting means with control signals conveyed along the control line.

* * * * *